(12) United States Patent
Ditlow et al.

(10) Patent No.: US 7,051,307 B2
(45) Date of Patent: May 23, 2006

(54) AUTONOMIC GRAPHICAL PARTITIONING

(75) Inventors: Gary S. Ditlow, Garrison, NY (US); Daria R. Dooling, Huntington, VT (US); Timothy G. Dunham, South Burlington, VT (US); William C. Leipold, Enosburg Falls, VT (US); Stephen D. Thomas, Essex Junction, VT (US); Ralph J. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 10/707,286

(22) Filed: Dec. 3, 2003

(65) Prior Publication Data

US 2005/0125756 A1 Jun. 9, 2005

(51) Int. Cl.
*G06F 17/50* (2006.01)
(52) U.S. Cl. .......................................... 716/7
(58) Field of Classification Search ............... 716/7
See application file for complete search history.

(56) References Cited

U.S. PATENT DOCUMENTS

| | | | |
|---|---|---|---|
| 4,890,238 A | 12/1989 | Klein et al. | |
| 5,493,510 A * | 2/1996 | Shikata | 716/9 |
| 5,675,500 A | 10/1997 | Kung et al. | |
| 5,784,290 A | 7/1998 | Kung et al. | |
| 5,943,243 A | 8/1999 | Sherlekar et al. | |
| 6,026,223 A * | 2/2000 | Scepanovic et al. | 716/10 |
| 6,134,702 A | 10/2000 | Scepanovic et al. | |
| 6,249,902 B1 * | 6/2001 | Igusa et al. | 716/10 |
| 6,301,694 B1 * | 10/2001 | Lee et al. | 716/11 |
| 6,532,578 B1 | 3/2003 | Chakraborty et al. | |
| 6,557,145 B1 * | 4/2003 | Boyle et al. | 716/2 |
| 6,668,365 B1 * | 12/2003 | Harn | 716/10 |
| 2003/0033583 A1 | 2/2003 | Gutwin et al. | |

OTHER PUBLICATIONS

"An Analytical Approach to Floorplanning for Hierarchical Building Blocks Layout", IBM Technical Disclosure Bulletin, vol. 33, No. 6A, Nov. 1990, pp. 164-165.

Ying et al., "An Analytical Approach to Floorplanning for Hierarchical Building Blocks Layout", IEEE Transactions on Computer-Aided Design, vol. 8, No. 4, Apr. 1989, pp. 403-412.

Yamada et al., "A Block Placement Method Based on Balloon Model", IEEE International Sympsosium on Circuits and Systems, vol. 3, 1990, 1680-1683.

(Continued)

*Primary Examiner*—Vuthe Siek
(74) *Attorney, Agent, or Firm*—Gibb I.P. Law Firm, LLC; Richard M. Kotulak, Esq.

(57) ABSTRACT

Disclosed is a method and structure that partitions an integrated circuit design by identifying logical blocks within the integrated circuit design based on size heuristics of logical macros in the design hierarchy. The invention determines whether the number of logical blocks is within a range of desired number of logical blocks and repeats the process of identifying logical blocks for different hierarchical levels of the integrated circuit design until the number of logical blocks is within the range of the desired number of logical blocks. This serves as a guide to partition the chip as opposed to a grid-like partitioning.

29 Claims, 9 Drawing Sheets

OTHER PUBLICATIONS

G. Vijayan, "Overlap Elimination in Floorplans", Proceedings Fourth CSI/IEEE International Symposium on VLSI Design, 1991, pp. 157-162.

Choi et al., "A Floorplanning Algorithm Using Rectangular Voronoi Diagram and Force-Directed Block Shaping", International Conference on Computer-Aided Design, Nov. 1991, pp. 56-59.

* cited by examiner

AUTONOMIC GRAPHICAL PARTITIONING

BACKGROUND OF INVENTION

1. Field of the Invention

The present invention generally relates to partitioning integrated circuit designs and more particularly to a methodology that bases the partitioning upon the logical hierarchy of the integrated circuit design and that maintains the partitions within a desired size limit.

2. Description of the Related Art

Current integrated circuit designs have grown large enough to require partitioning to handle the data in parallel. Automatic fracturing in a matrix or grid like manner results in inefficient pieces of graphics data. This inefficiency propagates to subsequent processing. This invention addresses how to automatically and intelligently partition design data based on macros.

SUMMARY OF INVENTION

The current invention automatically analyzes the hierarchy and geographical nature of the design and then determines the locations and sizes of windows to enclose the pieces of the design. It does this in a way that is adaptive to the data, since macros of the right size that exist in the data serve as a basic guide for partitioning the design data. More specifically, the invention partitions the integrated circuit design by identifying logical blocks within the integrated circuit design based on a size heuristic of logical macros in the design hierarchy. The invention determines whether the number of logical blocks is within a range of desired number of logical blocks and repeats the process of identifying logical blocks for different hierarchical levels of the integrated circuit design until the number of logical blocks is within the range of the desired number of logical blocks.

The invention identifies "primary" logical blocks comprising one level (e.g., the highest hierarchical level) of logical design hierarchy. If any of the primary logical blocks have a size above a predetermined maximum size limit the invention identifies "secondary" logical blocks of a lower level of the logical design hierarchy. Thus, logical blocks that are too large are subdivided into smaller logical components. This process is iteratively repeated for additional levels of the logical design hierarchy until all logical blocks are within the predetermined maximum size limit. Similarly, for primary logical blocks that have a size below a predetermined minimum size limit, the invention combines primary logical blocks together (repeatedly, if necessary) until the combination of primary logical blocks exceeds the predetermined minimum size limit. The invention calculates the predetermined maximum and minimum size limits by dividing the size of the integrated circuit design by the minimum and maximum number of logical blocks desired to be produced.

Once the right size and number of logical blocks is found, the invention eliminates duplicate logical blocks and overlapping logical blocks that overlap above an overlap percentage limit. With respect to the overlapping logical blocks, the invention initially eliminates overlapping blocks based on the overlap percentage limit. After eliminating such overlapping blocks, the invention counts the total number of remaining blocks, and revises the overlap percentage limit if the total number of remaining blocks is outside the range of the desired number of logical blocks.

After eliminating the duplicate and overlapping blocks, the invention expands the remaining logical blocks to cover unused space within boundaries of the integrated circuit design. At this point logical blocks become regional blocks. More specifically, the invention expands sides of the remaining blocks until the sides reach another block or reach a boundary of the integrated circuit design. This may still leave some white (unused) space. Therefore, the invention forms additional rectangles exclusively consisting of remaining unused space and incorporates the additional rectangles into adjacent blocks.

Now that the correct number and size of logical blocks has been determined and overlapping and duplicate blocks have been eliminated, the invention partitions the integrated circuit design into partitions corresponding to the remaining blocks. Then, the invention can perform separate checking of design features (e.g., design rule checking (DRC), etc.) within each partition of the integrated circuit design. This process performs the rule checking simultaneously within each of the partitions (e.g., in parallel) to increase the speed and efficiency of the rule checking process.

Further, by partitioning the design according to the logical barriers (as opposed to the conventional arbitrary grid based partitioning), the invention makes use of the hierarchical information contained within the design. The nesting of the data in the design is a direct result of the construction process of the logical units. Hence this information indicates what pieces would benefit the most by keeping the nesting in tact when the data is sectioned/partitioned.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
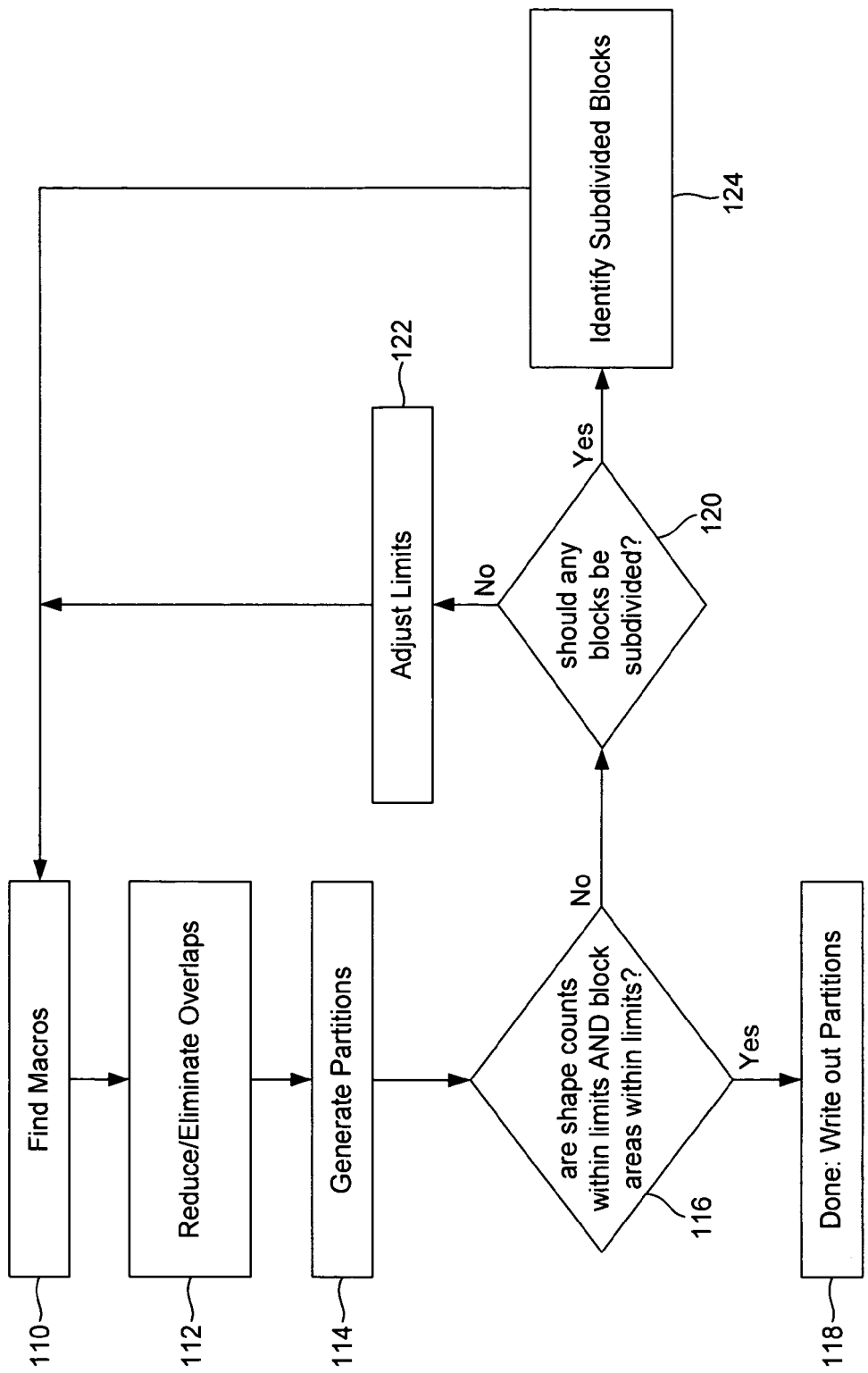
FIG. 1 is a flow diagram illustrating a preferred method of the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The current invention discloses three general steps to autonomically partition the graphics data. The first step finds the macros or cells of the right size. These rectangles are referred to herein as logical blocks. The second step eliminates duplicate blocks and blocks that have a large enough overlap. In some cases, the invention coalesces two overlapping blocks to make one new bigger block. The final step is to stretch blocks, recognize and join white spaces (spaces where no "right size" block exists). In some cases, the invention absorbs white spaces into neighboring blocks. Basically, one goal for selecting partitions is to keep cells intact (e.g., embedded SRAM arrays), and minimize overlaps between blocks.

Cells that are too big (e.g., wiring cells) will be cut when the design data is partitioned. Although a few bigger cells are cut, the invention produces faster run times and consumes less memory in the program that actually cuts the design data when compared to the conventional grid-based culling scheme. The criteria for selecting partitions is enhanced by considering flat shape counts in each partition (an indicator of device density within a given partition), by giving higher priority to certain types of cells (such as Static RAM, or Dynamic RAM), and by adjusting the criteria (such as density or location) to suit the subsequent processing.

Figure 2:
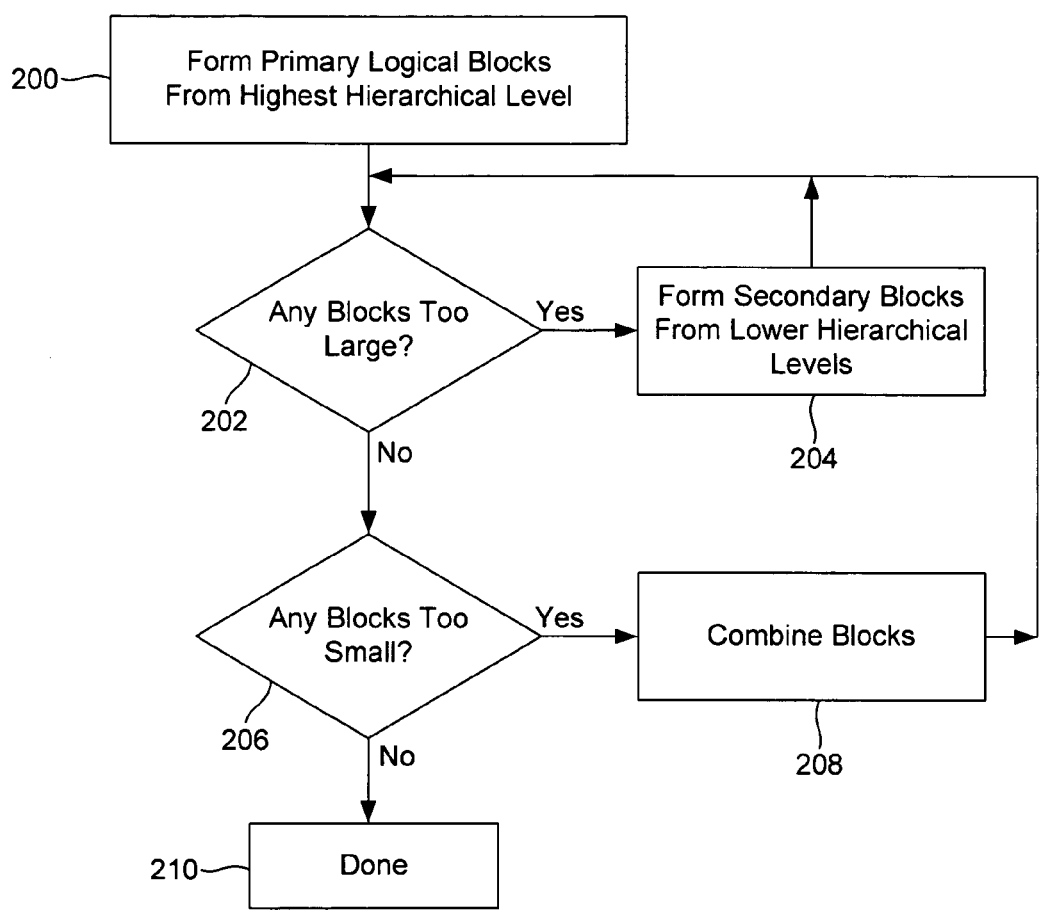
FIG. 2 is a flow diagram illustrating a preferred method of the invention.
Figure 3:
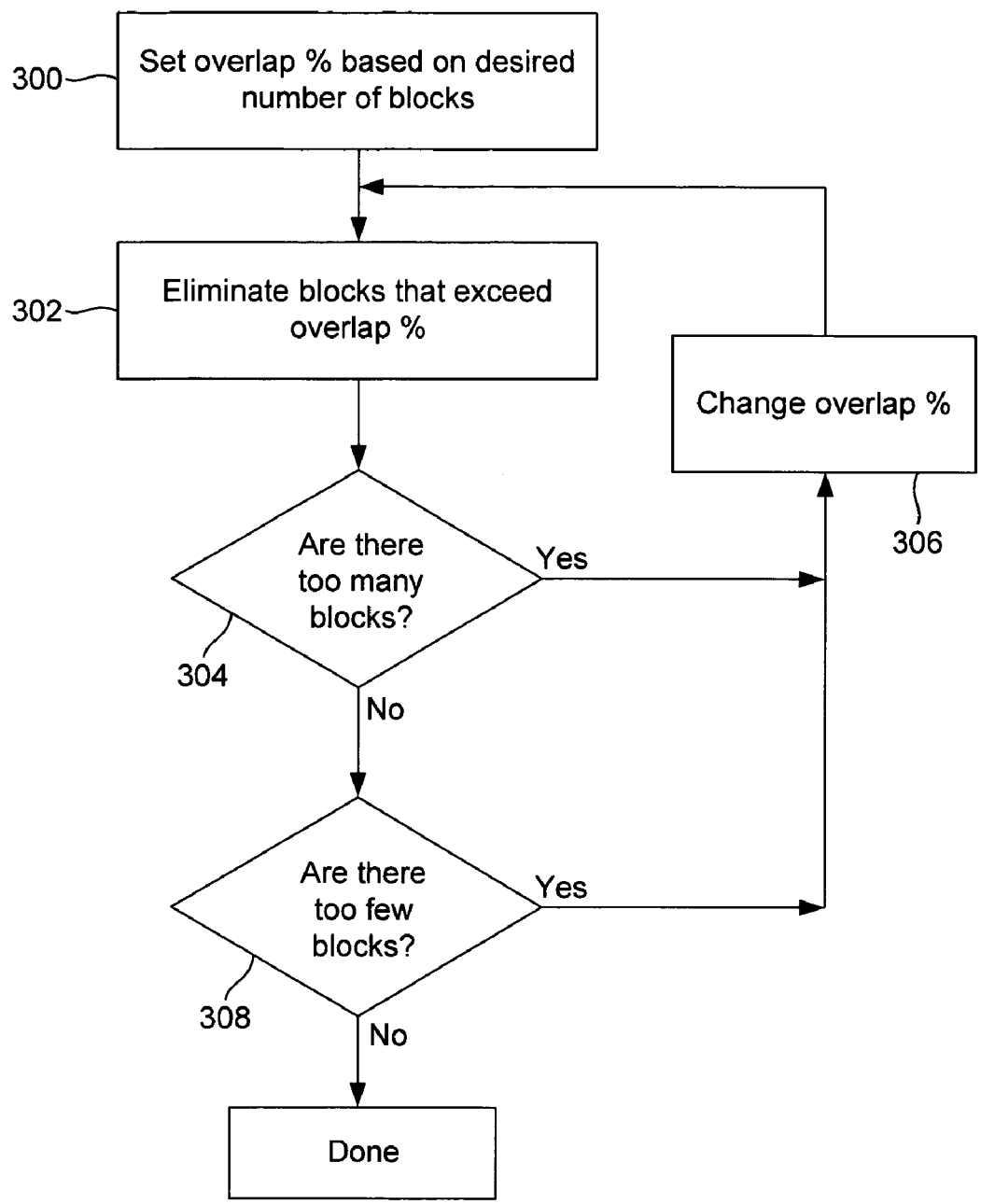
FIG. 3 is a flow diagram illustrating a preferred method of the invention.

FIG. 1 illustrates the overall processing flow of the inventive methodology. In item 110, the invention finds the macros and establishes the initial logical blocks within the integrated circuit design. The details of this process 110 are shown in FIG. 2. In item 112, the invention eliminates redundant logical blocks and reduces or eliminates overlapping logical blocks. The details of this process 112 are shown in FIG. 3. In item 114, the invention stretches out the remaining logical blocks to eliminate unused space (white space), and generates the partitions to allow the separate partitions of the integrated circuit design to be checked against rules and other standards simultaneously. The details of this process 114 are shown FIG. 4.

As shown in item 116, the invention checks to see whether the flat shape counts within each partition are acceptable and whether the size of each partition is within predetermined limits. If so, the invention writes out the partitions 118.

However, if any shape counts or block areas are not within the predetermined limits, the invention determines whether any of the blocks should be subdivided in item 120. The decision of whether to subdivide certain blocks depends upon whether any blocks will require an excessive amount of processing time for subsequent parallel application when compared to the other blocks, based on total shape count within each of the blocks. This is based on a comparison of the total shape count of each block when compared to the average shape count of the other blocks. Recursive partitioning of the blocks that have a relatively high number of shape counts will produce more uniform runtimes, thereby increasing efficiency.

Therefore, as shown in item 124, if it would be useful to subdivide the blocks, the invention subdivides certain blocks (again, along logical lines). The subdivided blocks could then be processed through the methodology of the invention (items 110, 112, 114, 116, 120, etc.) to create additional blocks in place of each of the subdivided blocks before the partitioning process 118.

Otherwise, if the shape counts of all blocks are substantially similar, yet the shape counts are still excessive when compared to the designers goals, the invention adjusts the limits used to find the macros in item 110 and repeats the processing with these new limits that are designed to bring the size of the partitions and the shape counts more closely aligned with the designers goals, as shown in item 122.

Thus, the invention first reads the entire graphics data, and then determines the extent of the bounding boxes, or least enclosing rectangle for all levels, for each cell. The invention starts at the highest level of the hierarchy (prime cell) and descends in search of blocks that are within area limits relative to the whole chip area. For example, initially the lower limit of the logical block size can be set to 5 percent of the chip area and the upper limit can be set to 10. The invention provides an iterative process to determine the correct limits to achieve a target number of blocks, for example, 50 to 100 blocks. The logical blocks are the rectangles that will guide partitioning.

This is shown in greater detail in the methodology shown in FIG. 2. More specifically, the invention first identifies "primary" logical blocks comprising one level (e.g., the highest hierarchical level) of logical design hierarchy 200. If any of the primary logical blocks have a size above a predetermined maximum size limit, as determined by a decision block 202, the invention identifies "secondary" logical blocks of a lower level of the logical design hierarchy in item 204. Thus, primary logical blocks that are too large are subdivided into smaller logical components. As shown by the processing loops between items 202 and 204, this process is iteratively repeated for additional levels of the logical design hierarchy until all logical blocks are within the predetermined maximum size limit.

Similarly, for primary logical blocks that have a size below a predetermined minimum size limit, as determined by decision block 206, the invention combines primary logical blocks together (repeatedly, if necessary) as shown in item 208. Thus, the invention would combine logical blocks that do not meet the minimum size limit with an adjacent block, and preferably with an adjacent block that also does not meet the minimum size limit. This process is repeated by looping back up to item 202 (to make sure that the new logical block produced from the combination of the previously separate logical blocks is not larger than the maximum size limit) until the combination of primary logical blocks exceeds the predetermined minimum size limit. As would be understood by one ordinarily skilled in the art, the invention uses various controls to prevent oscillating between excessively small logical blocks and excessively large logical blocks. For example, if one combination of undersized logical blocks produced an oversized logical block, that combination of undersized logical blocks would not be repeated during the next processing loop. The invention calculates the predetermined maximum and minimum size limits by dividing the size of the integrated circuit design by the minimum and maximum number of logical blocks desired to be produced.

Figure 5:
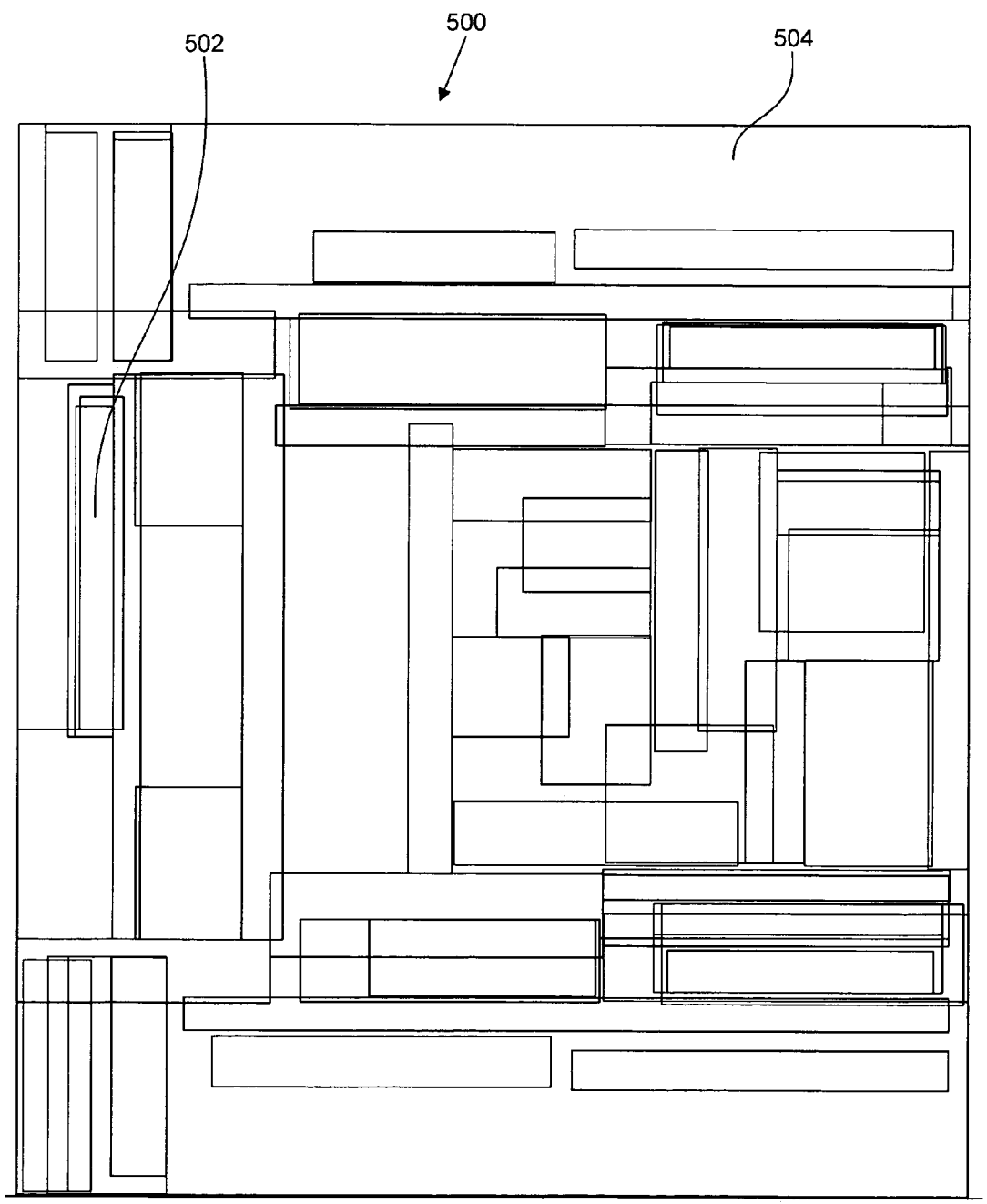
FIG. 5 is a schematic diagram of the logical blocks created within an integrated circuit design by the invention.

FIG. 5 is the output of the processing shown in FIG. 2 of finding the macros (logical blocks) of the right size. Blocks, which represent macros, that are between 1 and 3 percent of the total chip area for a particular chip are shown in FIG. 5. Item 500 represents the integrated circuit design and item 504 represents one of the logical blocks. Item 502 represents overlapping logical blocks.

Macros that do not fit this criteria do not effect the partitioning and are simply left as unused white space.

Once the right size and number of logical blocks is found (as shown in FIGS. 2 and 5), the invention eliminates duplicate logical blocks and overlapping logical blocks that overlap above an overlap percentage limit. With respect to the overlapping logical blocks, the invention initially eliminates overlapping blocks based on the overlap percentage limit. After eliminating such overlapping blocks, the invention counts the total number of remaining blocks, and revises the overlap percentage limit if the total number of remaining blocks is outside the range of the desired number of logical blocks.

Eliminating a block means marking it as deleted and not considering it again. Since blocks are only a guide for partitioning, overlapping blocks add no value and can be readily removed. The non-overlapping area of the eliminated block will be covered by another block, or by white space that becomes a block, as explained in greater detail below.

During this processing, duplicate blocks (e.g., blocks that completely overlap, or are completely overlapped by other blocks) are eliminated. In addition, blocks whose overlap is large enough (for example, the overlap limit can be set to 60% based on area) are also eliminated. Blocks are examined in pairs to discern overlap between the two. Additional overlap restrictions can also be applied. For example, blocks are further eliminated when the sum of overlap percentages of all neighboring blocks is above an acceptable overlap threshold (e.g., 10%).

The overlap limit is refined based on the data and the resulting block count in an iterative process. If the total block count is greater than a maximum block count limit, the overlap threshold percentage is lowered and the non-deleted blocks are reconsidered for elimination. Similarly, if the total block count is less than a minimum block count limit, the overlap threshold percentage is raised and the process is repeated to prevent too many blocks from being eliminated.

This processing is shown in flowchart form in FIG. 3. More specifically, in item 300, the invention initially sets the target for the desired number of logical blocks (which is the same as the minimum and maximum number of logical blocks desired to be produced, that is discussed above) and provides an overlap percentage that is based upon that desired number of logical blocks. Item 302 represents the elimination of blocks that overlap above the percentage established in item 300. In item 304, the invention checks to see whether there are still too many blocks remaining after the blocks are eliminated. Similarly, in item 308, the invention checks to see whether there are too few blocks after the blocks are eliminated in step 302. The limits on the number of blocks could be the same or different than the maximum and minimum block count limits discussed above.

Figure 6:
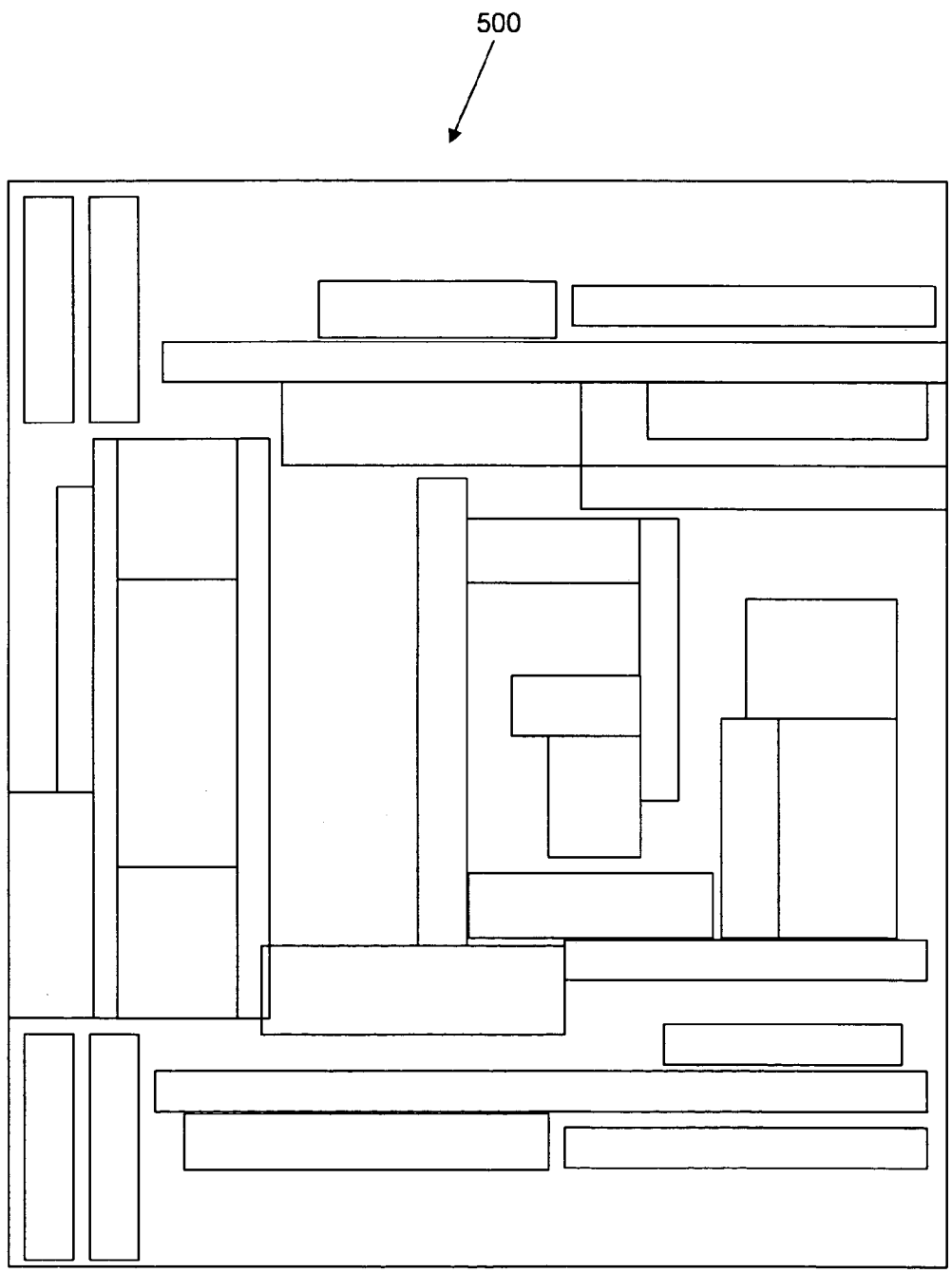
FIG. 6 is a schematic diagram of the logical blocks created within an integrated circuit design by the invention.

In both cases, if there are too few or too many blocks after step 302, the overlap percentages change in item 306 and processing returns to item 302 to eliminate blocks based on the new overlap percentage. Therefore, the invention decreases the overlap percentage limit (306) if there are too many blocks (304) so that when blocks are eliminated in item 302, a greater number of blocks will be eliminated. Similarly, if there are too few blocks (308), the overlap percentage 306 is increased so that when blocks are eliminated in item 302, less blocks will be eliminated allowing more blocks to remain. These processing loops repeat until the number of blocks is within the desired limit, or until a certain number of iterations has been completed. FIG. 6 shows processing after duplicate blocks are deleted and blocks with greater overlap than the overlap percentage are deleted. FIG. 6 is the output of the processing shown in FIG. 3 after reducing the number of overlapping blocks.

This method works well since a chip with all overlapping blocks will have the final block count driven primarily by the acceptable overlap. For chips with no or few overlapping blocks, the final block count is driven more by the total block count. During the block reduction step, blocks whose overlap percentages are big enough and who may be coalesced without incurring additional overlaps may be replaced by a single block (which is the least enclosing rectangle of the two). For example, block reduction can be implemented with an intersection graph containing edge weights which represent overlap percentages, a priority queue type of structure for the overlap percentage sums, and an array of block structures.

Lastly, the blocks are expanded to touch each other so full coverage of the design data is achieved. The order in which areas are expanded can either be random or based on a ranked area list of the blocks. As a result of this process, there may be areas of the chip that are not in a block and thus need to be included. These areas are called white spaces.

Figure 4:
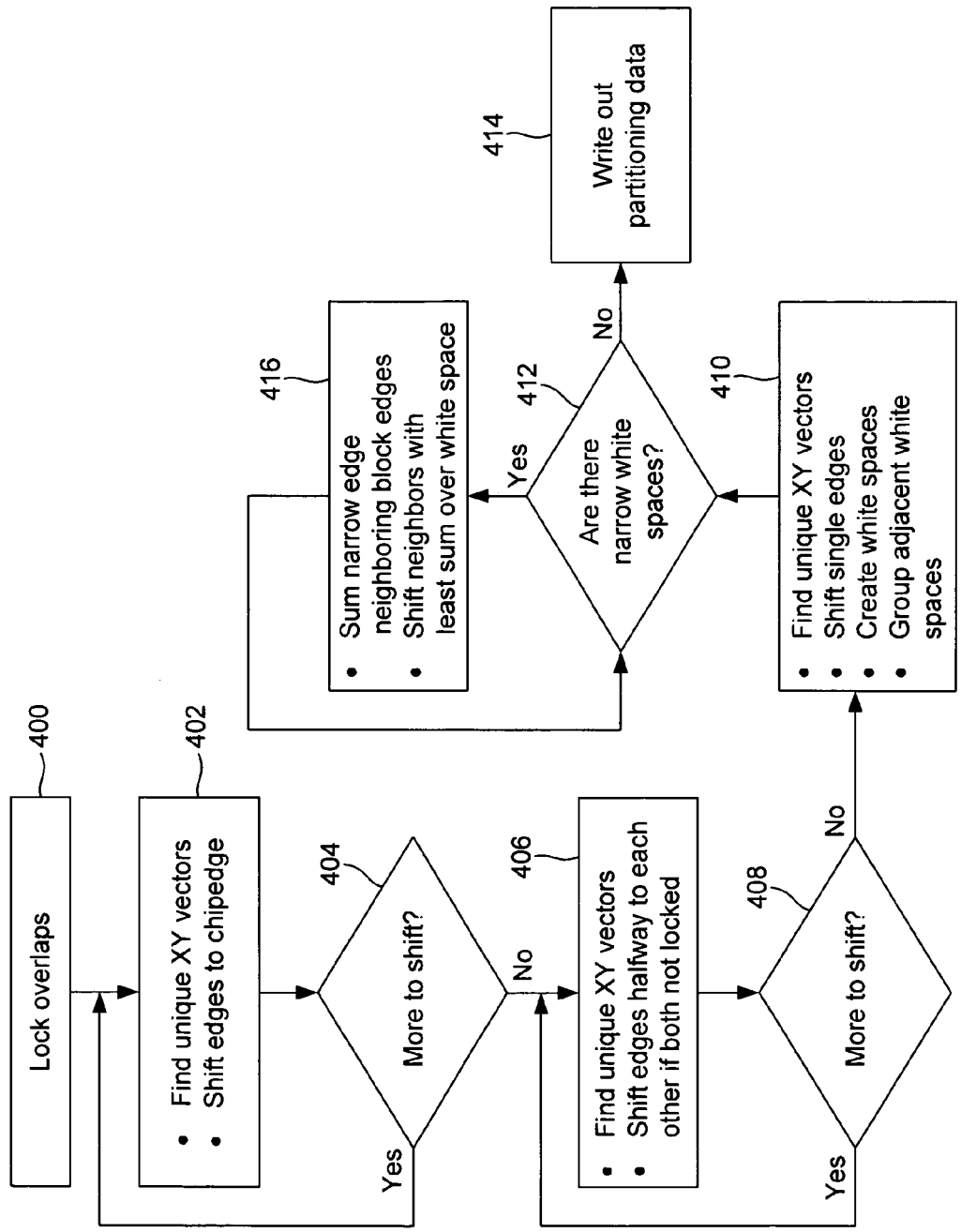
FIG. 4 is a flow diagram illustrating a preferred method of the invention.

With the invention, the adjacent white spaces are grouped intelligently. More specifically, as shown in FIG. 4, the edges that overlap another block are locked in item 400 to prevent those edges from being moved in this expansion process so as to prevent any additional and unwanted overlap between the blocks. In item 402, the invention determines the X–Y vectors that make up each edge that is adjacent to the edges of the chip. Each edge is shifted out toward the edge of the chip as far as possible. In item 404, if there are more edges to shift out toward the chip edge, processing proceeds back to item 402.

Figure 7:
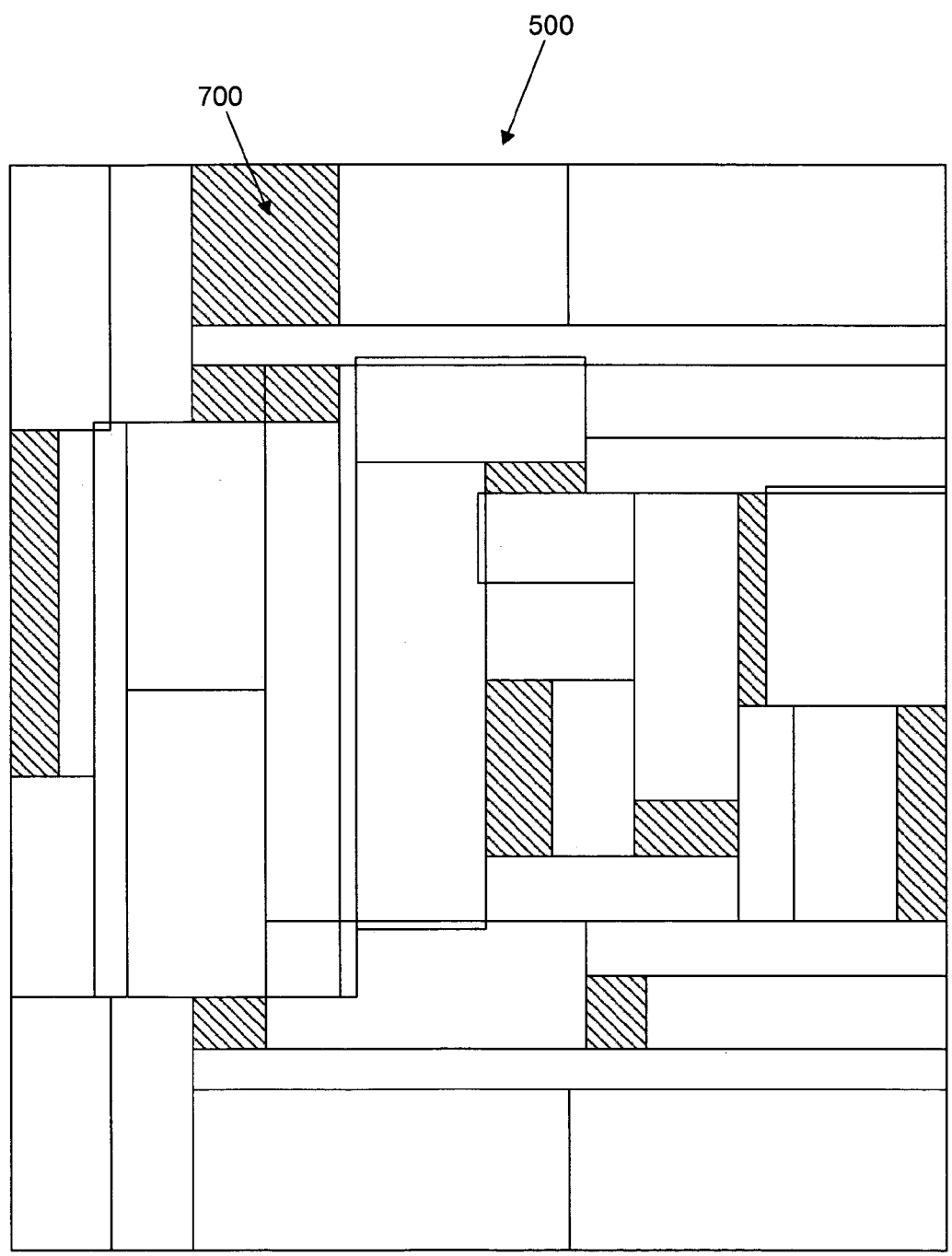
FIG. 7 is a schematic diagram of the regional blocks created within an integrated circuit design by the invention.
Figure 8:
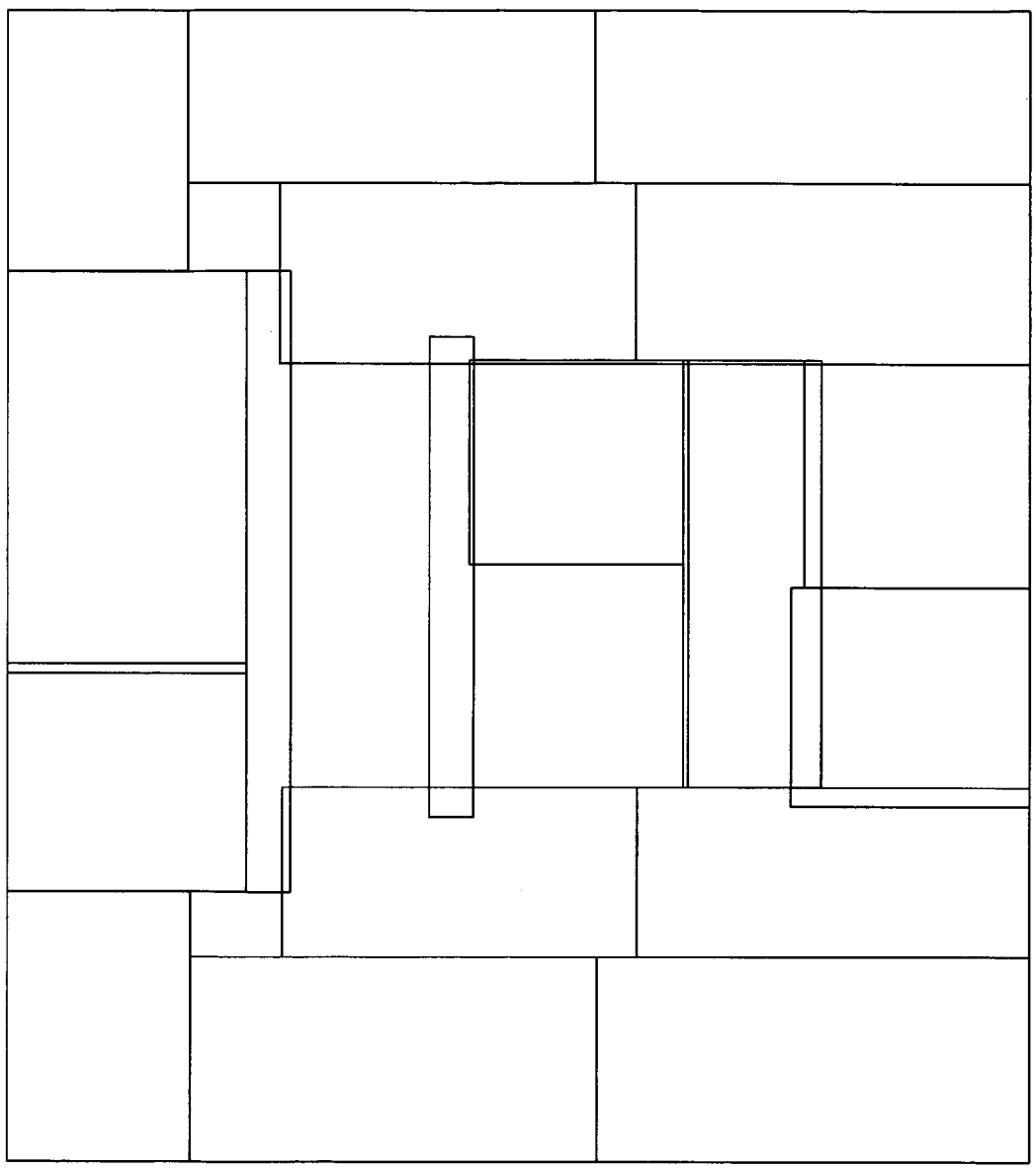
FIG. 8 is a schematic diagram of the final regional blocks created within an integrated circuit design by the invention.

Similarly, in item 406, the X–Y vectors of each edge that faces another block edge are evaluated and the edges are moved toward each other so as to increase the size of each of the blocks evenly. If there are more edges to shift in item 408, processing returns to item 406. In item 410, the invention locates the X–Y vectors of edges that are adjacent to white space and shifts these edges toward the white spaces as far as possible, without overlapping another block. Remaining white spaces can be grouped together to form new blocks. In item 412, the invention checks to see whether there are any narrow white spaces. Narrow white spaces are those white spaces whose length-to-width ratio exceeds a predetermined length-to-width ratio, which can be set by the designer depending upon various design constraints. In item 416, the invention shifts the edge of an adjacent block to cover the narrow white spaces in a manner that minimizes the amount of overlap between the blocks. Thus, "narrow" white space regions are evaluated to look for the least increase in block area to fully encompass the white space. This is accomplished by summing the adjacent edges of the blocks on opposing sides of the white space and picking the side having the shortest length to be the side that is shifted, such that the resulting shifts will cause the minimum increase of overlap. After this processing is completed, the partitioning data is written out as shown in item 414. The resulting combination of stretched blocks and significant white spaces (that are not logically associated with the original macro or cell) are ultimately written out as individual pieces of text and graphics data for subsequent graphics data processing. FIG. 7 illustrates the white spaces as areas 700 and FIG. 8 illustrates the blocks after they have been stretched to cover the white spaces.

Now that the correct number and size of logical blocks has been determined and overlapping and duplicate blocks have been eliminated, the invention partitions the integrated circuit design into partitions corresponding to the remaining blocks. Then, the invention can perform separate parallel applications. (e.g., design rule checking (DRC), etc.) within each partition of the integrated circuit design. The DRC process performs the rule checking simultaneously within each of the partitions (e.g., in parallel) to increase the speed and efficiency of the rule checking process. Some jobs, such as Design Rule Checking, require a margin around each partition so processing of the valid boundary is correct. Margins may be added to all partitions if necessary.

Figure 9:
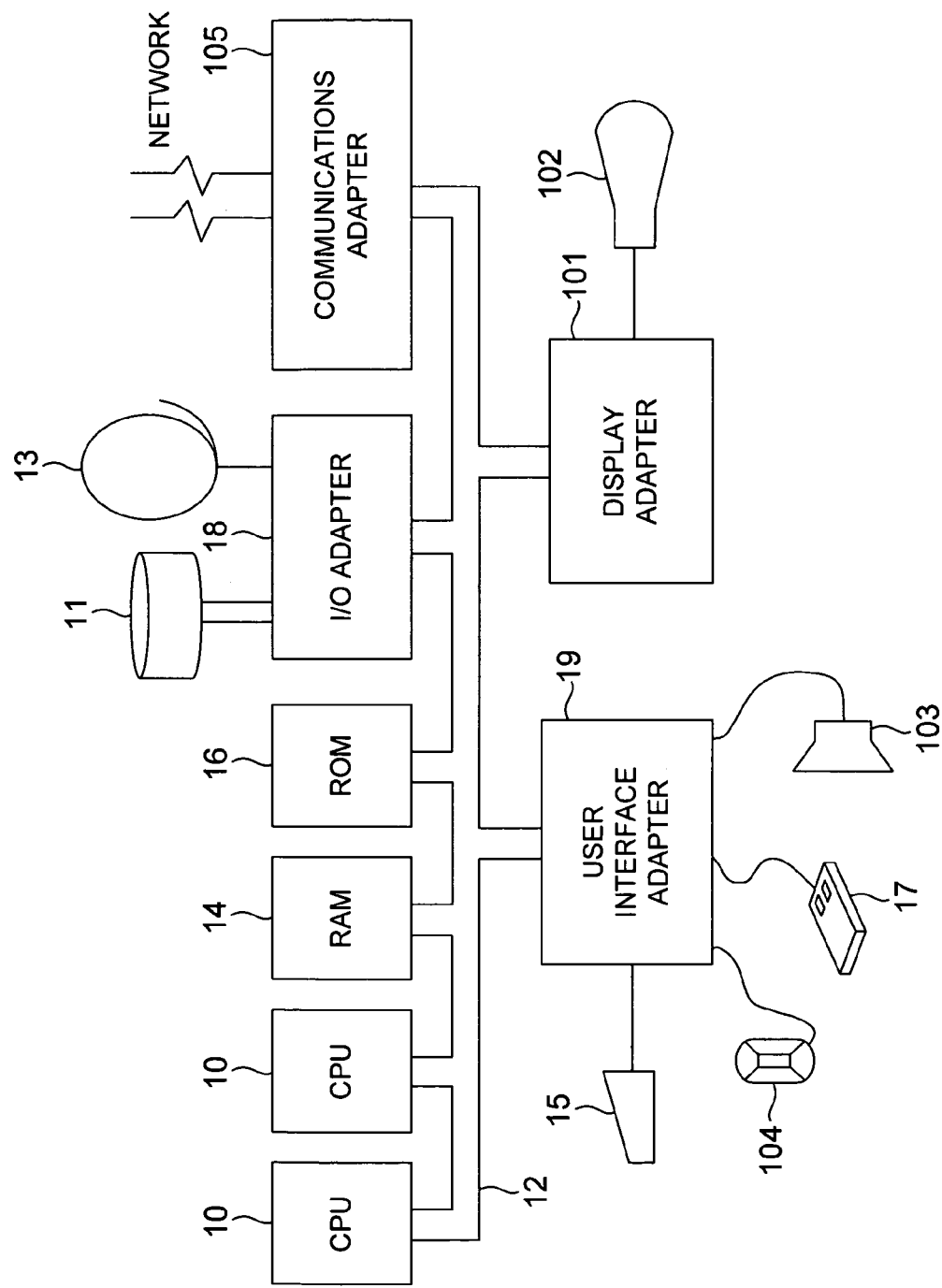
FIG. 9 is an exemplary hardware embodiment upon which the invention can be implemented.

FIG. 9 depicts a representative hardware environment for practicing the present invention, which illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 104, and/or other user interface devices such as touch screen device (not shown) to bus 12, communication adapter 105 for connecting the information handling system to a data processing network, and display adapter 101 for connecting bus 12 to display device 102. A program storage device readable by the disk or tape units, is used to load the instructions which operate the invention also loaded onto the computer system.

The invention first emphasizes that units that were designed together should serve as a basis for partitioning the chip and should stay together during subsequent chip processing, and second, the macro partitioning process relies on and is adaptive to the design data input. The invention achieves these goals in an automatic, adaptive way. Subsequent chip processing includes Ground rule Checking, Optical Proximity Corrections, and density adjustments. Thus, the invention maintains the hierarchy in appropriate geographical areas. Subsequent processing of this data as well as the fracturing process are facilitated and optimized because of the resulting hierarchies. This is analagous to analyzing a problem and then developing a solution to match the data.

While the invention has been described in terms of preferred embodiments, those skilled in the art will recognize that the invention can be practiced with modification within the spirit and scope of the appended claims.

The invention claimed is:

1. A method of partitioning an integrated circuit design comprising: identifying logical blocks within said integrated circuit design:
    eliminating overlapping logical blocks that overlap above an overlap percentage limit; and
    expanding remaining logical blocks to cover unused space within boundaries of said integrated circuit design,
    wherein said process of eliminating overlapping logical blocks comprises: initially eliminating overlapping blocks based on said overlap percentage limit; counting the total number of remaining blocks; and revising said overlap percentage limit if said total number of remaining blocks is outside the range of the desired number of logical blocks.

2. The method in claim 1, wherein said process of identifying logical blocks comprises:
    identifying primary logical blocks comprising the highest level of logical design hierarchy of said integrated circuit design;
    for ones of said primary logical blocks that have a size above a predetermined maximum size limit, identifying secondary logical blocks of the second-highest level of said logical design hierarchy; and
    iteratively repeating said process of identifying secondary logical blocks for additional levels of said logical design hierarchy until all logical blocks are within said predetermined maximum size limit.

3. The method in claim 2, further comprising calculating said predetermined maximum size limit by dividing the size of said integrated circuit design by the minimum number of logical blocks desired to be produced.

4. The method in claim 1, wherein said process of identifying logical blocks comprises:
    identifying primary logical blocks comprising the highest level of logical design hierarchy of said integrated circuit design; and
    for ones of said primary logical blocks that have a size below a predetermined minimum size limit, combining said primary logical blocks until a combination of said primary logical blocks exceeds said predetermined minimum size limit.

5. The method in claim 4, further comprising calculating said predetermined minimum size limit by dividing the size of said integrated circuit design by the maximum number of logical blocks desired to be produced.

6. The method in claim 1, wherein said process of expanding said remaining logical blocks comprises:
    expanding sides of said remaining blocks until said sides reach another block or reach a boundary of said integrated circuit design;
    forming additional rectangles from remaining unused space; and
    incorporating said additional rectangles into adjacent blocks.

7. A method of partitioning an integrated circuit design comprising identifying logical blocks within said integrated circuit design, wherein said logical blocks are within a predetermined maximum size limit and a predetermined minimum size limit;
    eliminating overlapping logical blocks that overlap above an overlap percentage limit;
    expanding remaining logical blocks to cover unused space within boundaries of said integrated circuit design;
    partitioning said integrated circuit design into partitions corresponding to said remaining blocks; and
    running applications with each partition of said integrated circuit design in parallel,
    wherein said process of eliminating overlapping logical blocks comprises:
    initially eliminating overlapping blocks based on said overlap percentage limit;
    counting the total number of remaining blocks; and
    revising said overlap percentage limit if said total number of remaining blocks is outside the range of the desired number of logical blocks.

8. The method in claim 7, wherein said process of identifying logical blocks comprises:

identifying primary logical blocks comprising the highest level of logical design hierarchy of said integrated circuit design;

for ones of said primary logical blocks that have a size above said predetermined maximum size limit, identifying secondary logical blocks of the second-highest level of said logical design hierarchy; and iteratively repeating said process of identifying secondary logic blocks for additional levels of said logical design hierarchy until all logical blocks are within said predetermined maximum size limit.

9. The method in claim 8, further comprising calculating said predetermined maximum size limit by dividing the size of said integrated circuit design by the minimum number of logical blocks desired to be produced.

10. The method in claim 7, wherein said process of identifying logical blocks comprises:

identifying primary logical blocks comprising the highest level of logical design hierarchy of said integrated circuit design; and for ones of said primary logical blocks that have a size below said predetermined minimum size limit, combining said primary logical blocks until a combination of said primary logical blocks exceeds said predetermined minimum size limit.

11. The method in claim 10, further comprising calculating said predetermined minimum size limit by dividing the size of said integrated circuit design by the maximum number of logical blocks desired to be produced.

12. The method in claim 7, wherein said process of expanding said remaining logical blocks comprises:

expanding sides of said remaining blocks until said sides reach another block or reach a boundary of said integrated circuit design;

forming additional rectangles from remaining unused space; and incorporating said additional rectangles into adjacent blocks.

13. A method of partitioning an integrated circuit design comprising:

identifying logical blocks within said integrated circuit design;

eliminating overlapping logical blocks that overlap above an overlap percentage limit;

expanding remaining logical blocks to cover unused space within boundaries of said integrated circuit design by expanding sides of said remaining blocks until sides reach another block or reach a boundary of said integrated circuit design;

forming additional rectangles from remaining unused space; and incorporating said additional rectangles into adjacent blocks, wherein said process of eliminating overlapping logical blocks comprises:

initially eliminating overlapping blocks based on said overlap percentage limit;

counting the total number of remaining blocks; and revising said overlap percentage limit if said total number of remaining blocks is outside to range of the desired number of logical blocks.

14. The method in claim 13, wherein said process of identifying logical blocks comprises:

identifying primary logical blocks comprising the highest level of logical design hierarchy of said integrated circuit design;

for ones of said primary logical blocks that have a size above a predetermined maximum size limit, identifying secondary logical blocks of the second-highest level of said logical design hierarchy; and iteratively repeating said process of identifying secondary logic blocks for additional levels of said logical design hierarchy until all logical blocks are within said predetermined maximum size limit.

15. The method in claim 14, further comprising calculating said predetermined maximum size limit by dividing the size of said integrated circuit design by the minimum number of logical blocks desired to be produced.

16. The method in claim 13, wherein said process of identifying logical blocks comprises:

identifying primary logical blocks comprising the highest level of logical design hierarchy of said integrated circuit design; and for ones of said primary logical blocks that have a size below a predetermined minimum size limit, combining said primary logical blocks until a combination of said primary logical blocks exceeds said predetermined minimum size limit.

17. The method in claim 16, further comprising calculating said predetermined minimum size limit by dividing the size of said integrated circuit design by the maximum number of logical blocks desired to be produced.

18. A program storage device for use with a computer, said program storage device tangibly embodying a program of instructions executable by said computer for performing a method of partitioning an integrated circuit design, said method comprising:

identifying logical blocks within said integrated circuit design;

eliminating overlapping logical blocks that overlap above an overlap percentage limit; and expanding remaining logical blocks to cover unused space within boundaries of said integrated circuit design, wherein said process of eliminating overlapping logical blocks comprises:

initially eliminating overlapping blocks based on said overlap percentage limit;

counting the total number of remaining blocks; and revising said overlap percentage limit if said total number of remaining blocks is outside the range of the desired number of logical blocks.

19. The program storage device in claim 18, wherein said process of identifying logical blocks comprises:

identifying primary logical blocks comprising the highest level of logical design hierarchy of said integrated circuit design;

for ones of said primary logical blocks that have a size above a predetermined maximum size limit, identifying secondary logical blocks of the second-highest level of said logical design hierarchy; and iteratively repeating said process of identifying secondary logic blocks for additional levels of said logical design hierarchy until all logical blocks are within said predetermined maximum size limit.

20. The program storage device in claim 19, wherein said method further comprises calculating said predetermined maximum size limit by dividing the size of said integrated circuit design by the minimum number of logical blocks desired to be produced.

21. The program storage device in claim 18, wherein said process of identifying logical blocks comprises:
   identifying primary logical blocks comprising the highest level of logical design hierarchy of said integrated circuit design; and
   for ones of said primary logical blocks that have a size below a predetermined minimum size limit, combining said primary logical blocks until a combination of said primary logical blocks exceeds said predetermined minimum size limit.

22. The program storage device in claim 21, wherein said method further comprises calculating said predetermined minimum size limit by dividing the size of said integrated circuit design by the maximum number of logical blocks desired to be produced.

23. The program storage device in claim 18, wherein said process of expanding said remaining blocks comprises:
   expanding sides of said remaining blocks until said sides reach another block or reach a boundary of said integrated circuit design;
   forming additional rectangles from remaining unused space; and
   incorporating said additional rectangles into adjacent blocks.

24. A service of partitioning an integrated circuit design comprising:
   identifying logical blocks within said integrated circuit design;
   eliminating overlapping logical blocks that overlap above an overlap percentage limit; and
   expanding remaining logical blocks to cover unused space within boundaries of said integrated circuit design,
   wherein said process of eliminating overlapping logical blocks comprises:
   initially eliminating overlapping blocks based on said overlap percentage limit;
   counting the total number of remaining blocks; and revising said overlap percentage limit if said total number of remaining blocks is outside the range of the desired number of logical blocks.

25. The service in claim 24, wherein said process of identifying logical blocks comprises:
   identifying primary logical blocks comprising the highest level of logical design hierarchy of said integrated circuit design;
   for ones of said primary logical blocks that have a size above a predetermined maximum size limit, identifying secondary logical blocks of the second-highest level of said logical design hierarchy; and
   iteratively repeating said process of identifying secondary logic blocks for additional levels of said logical design hierarchy until all logical blocks are within said predetermined maximum size limit.

26. The service in claim 25, further comprising calculating said predetermined maximum size limit by dividing the size of said integrated circuit design by the minimum number of logical blocks desired to be produced.

27. The service in claim 24, wherein said process of identifying logical blocks comprises:
   identifying primary logical blocks comprising the highest level of logical design hierarchy of said integrated circuit design; and
   for ones of said primary logical blocks that have a size below a predetermined minimum size limit, combining said primary logical blocks until a combination of said primary logical blocks exceeds said predetermined minimum size limit.

28. The service in claim 27, further comprising calculating said predetermined minimum size limit by dividing the size of said integrated circuit design by the maximum number of logical blocks desired to be produced.

29. The service in claim 24, wherein said process of expanding said remaining logical blocks comprises:
   expanding sides of said remaining blocks until said sides reach another block or reach a boundary of said integrated circuit design;
   farming additional rectangles from remaining unused space; and
   incorporating said additional rectangles into adjacent blocks.

* * * * *